United States Patent [19]

Lorenz et al.

[11] Patent Number: 4,543,315
[45] Date of Patent: Sep. 24, 1985

[54] STORAGE-STABLE PHOTOSENSITIVE COMPOSITION AND ARTICLE WITH ADDUCT OF DIAZO RESIN AND AMORPHOUS SULFOPOLYESTER

[75] Inventors: William J. Lorenz; Wayne K. Larson, both of Maplewood, Minn.

[73] Assignee: Minnesota Mining and Manufacturing Company, St. Paul, Minn.

[21] Appl. No.: 537,828

[22] Filed: Sep. 30, 1983

[51] Int. Cl.[4] ............... G03C 1/54; G03C 1/68; G03C 1/71
[52] U.S. Cl. .................... 430/156; 430/157; 430/158; 430/163; 430/175; 430/176; 430/302; 430/281
[58] Field of Search ............ 430/175, 176, 163, 188, 430/157, 158, 302, 156, 281; 260/141 F

[56] References Cited

U.S. PATENT DOCUMENTS

| | | | |
|---|---|---|---|
| 3,779,993 | 12/1973 | Kibler et al. | 528/302 |
| 4,052,368 | 10/1977 | Larson | 528/301 |
| 4,101,274 | 7/1978 | Beutler et al. | 560/85 |
| 4,300,580 | 11/1981 | O'Neill et al. | 424/10 |
| 4,304,901 | 12/1981 | O'Neill et al. | 528/290 |
| 4,401,743 | 8/1983 | Incremona | 430/302 |
| 4,480,085 | 10/1984 | Larson | 528/295 |

*Primary Examiner*—Charles L. Bowers, Jr.
*Attorney, Agent, or Firm*—Donald M. Sell; James A. Smith; Gerald F. Chernivec

[57] ABSTRACT

A presensitized article having a radiation-sensitive layer comprising an adduct of an amorphous sulfopolyester and a diazonium resin is described which does not exhibit blocking on being stored in stacks for prolonged periods of time. The article can be exposed to radiation and developed via aqueous solvents to provide a lithographic plate that provides clean, scum-free copies, and that can be stored in a high humidity atmosphere without failure.

12 Claims, No Drawings

STORAGE-STABLE PHOTOSENSITIVE COMPOSITION AND ARTICLE WITH ADDUCT OF DIAZO RESIN AND AMORPHOUS SULFOPOLYESTER

FIELD OF THE INVENTION

This ivention relates to a radiation-sensitive composition and an aqueous solvent-developabale light-sensitive article, preferably capable of forming a lithographic plate, comprising a substrate having a coating of the composition thereon. More specifically, the invention relates to a radiation-sensitive polymeric adduct of a diazonium resin and a low molecular weight polymer having a plurality of sulfo groups and to an article having a coating of the polymeric adduct thereon.

DISCUSSION OF THE PRIOR ART

Diazonium compounds are well known and widely used to imnpart light sensitivity to negative-acting photolithographic printing plates. Upon exposure, the photochemical decomposition of the diazonium salt produces physical and chemical changes, such as crosslinking, insolubility, increased adhesion, etc., such that exposed areas are rendered selectivley insoluble when constrasted with unexposed areas.

Most commonly utilized diazonium compounds are the diazonium resins, such as those described in U.S. Pat. No. 2,714,066, which are synthesized by the condensation reaction of an active carbonyl compound with a diazonium compound.

Diazonium resins are disclosed in many patents and have been coated either alone, such as in U.S. Pat. No. 2,714,066; overcoated with a resinous layer, such as disclosed in U.S. Pat. No. 3,136,637; overcoated with a photopolymer, such as is disclosed in U.S. Pat. No. 3,905,815; or included in conjunction with other resinous materials, such as disclosed in U.S. Pat. No. 3,660,097.

Variations in the properties of diazonium resins have been achieved by employing different anions therewith, e.g., as is disclosed in U.S. Pat. No. 3,790,556, wherein the solubility properties thereof are changed, as well as humidity resistance, i.e., storage life. Furthermore, simple monomolecular diazonium salts have been reacted with high molecular weight sulfonated phenol-formaldehyde resins, as disclosed in U.S. Pat. No. 3,199,981, to prepare, in association with other resins, positive printing plates from positive originals.

One common characteristic of light-sensitive articles utilizing diazonium resins is that these resins have a tendency to remain or adhere in the non-imaged areas after chemical development or processing. Where a lithographic plate is the desired end result, this small amount of unremoved resin can result in ink toning and scumming in background areas. Reasons for the retention of diazonium resin in the non-image areas are believed to be due to physical attachment thereof to the substrates, insoluble fractions, minor decomposition products, or perhaps a combination thereof. This specific problem can be typically solved by utilizing special chemical in the developer, called desensitizing agents, which aid in the complete removal of the unexposed diazonium resin material. For example, U.S. Pat. Nos. 3,905,815, 3,891,438, 3,891,439 and 3,669,660 disclose solutions relating to the foregoing problem.

This problem of ink toning and summing in the background of a lithographic plate during printing has been substantially eliminated by the use of a radiation-sensitive adduct of a diazonium resin having a plurality of pendant diazonium sites and a polymer having a plurality of sulfo groups, as is disclosed in U.S. Pat. No. 4,401,743. While it might be anticipated that such a combination of polyionic species would result in a completely insoluble ionically crosslinked mass, not suitable for printing plate utility, such has not been the case. A soluble and highly useful material for presensitized printing plates has resulted from the combination.

However, even with the use of this adduct, there still remain problems in the manufacture of lithographic plates caused by the difficulty of removing the high boiling polar solvents used to make coatings of the adduct, by the tendency of the coated plates to block when they are placed in intimate contact with one another and to lose image areas on the press after they have been stored in a humid environment.

A wide varitey of simple developers and techniques can be utilized to prepare a printing plate made with the disclosed composition, such as water or water/alcohol, simple machine processors, and in some instances, on-press processing. Obviously, the simplicity of the developer used in providing the printing plate is environmentally desirable because of the reduced necessity for desensitizing agents and conventional harsh or polluting developers.

SUMMARY OF THE INVENTION

In accordance with the invention, there is provided a low boiling, solvent-soluble, light-sensitive polymeric adduct of: (1) a water-soluble diazonium resin having a plurality of pendant diazonium groups, and (2) a low molecular weight amorphous sulfopolyester having a plurality of sulfo groups. There is also provided a light-sensitive article comprising a substrate bearing a coating of the adduct.

DETAILED DECRIPTION OF THE INVENTION

Exemplary diazonium resins suitable for use in the invention are described in U.S. Pat. No. 2,714,066, with the preferred resins being the salts of the condensation product of paraformaldehyde and p-phenylaminodiazonium salts. The anion associated with the diazonium resin is not or particular importance, with the exception of solubility characteristics relative to the reactant and coating solvent used.

Exemplary amorphous sulfopolyesters having a plurality of sulfo groups are described in U.S. Pat. No. 4,480,085, incorporated herein by reference. These sulfopolyesters are amorphous polyesters having a preferred weight average molecular weight of from about 8,000 to about 50,000 with repeating units of the formula

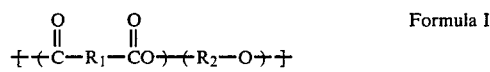

Formula I and, optionally, up to 30 weight percent of units having the formula:

Formula II wherein $R_1$ is one or more divalent organic groups selected from $R_2$, $R_3$ and $R_4$ groups in which $R_3$ are ortho- and peri-arylene groups having 6 to 14 carbon atoms, $R_4$ are meta- and para-arylene groups having 6 to 14 carbon atoms, and $R_2$ and $R_5$ are the same or different divalent aliphatic groups that are straight chain, a branched chain having 2 to 10 carbon atoms and, optionally, one to four caternary oxygen atoms, of which no two are attached together or to the same carbon atom, or a ring of 4 to 6 carbon atoms or 3 to 6 carbon atoms and one oxygen;

with the provisos that the mole percentage of $R_3$ is at least about 35% of the total moles of $R_1$ and $R_5$ and that per 100 moles of combined $R_1$, $R_2$ and $R_5$ there are present 1 to 15 moles of attached -$SO_3M$ groups in which M is a cation.

A preferred sulfopolyester for use in the light-sensitive adduct of the invention has the formula Formula III

wherein $R_3$ is as defined above, $R_6$ is a straight chain alkylene group having 2 to 6 carbon atoms;

$R_7$ is a 5-sulfo-m-phenylene group, a is 0, 1 or 2;

b is an integer from about 0 to about 15;

the ratio of b to c is from about 10 to about 15 to 1; and

M is an alkali metal.

The amorphous sulfopolyesters are prepared by the reaction of dicarboxylic acids (or diesters, anhydrides, etc. thereof) with glycols and, optionally, hydroxyaliphaticcarboxylic acids in the presence of acid catalysts, such as antimony trioxide, utilizing heat and pressure as desired. Normally, an excess of the glycol is supplied and subsequently removed by conventional techniques during the latter stages of polymerization. When desirable, a hindered phenol antioxidant may be added to the reaction mixture to protect the polyester from oxidation.

The amorphous sulfopolyesters provide a sulfo group-containing moiety which, in an metathetical reaction with the diazonium group of the diazonium resin, forms a polymeric salt (called an "adduct" in this application, in which both the positive and negative ions are polymeric) that, surprisingly, is soluble in many low boiling solvents and has desirable physical properties, e.g., for lithographic plates, such as flexibility, abrasion resistance, aqueous solvent solubility or dispersibility, and hydrophobicity, i.e., humidity resistance.

The radiation-sensitive polymeric adduct can be prepared by mixing a solution (preferably from about 1 to about 10 percent by weight) of the diazonium resin in water or aqueous alcohol with a solution (preferably from about 1 to about 10 percent by weight) of the sulfopolyester in water or aqueous alcohol, whereupon the polymeric adduct precipitates as a fine particulate solid which can be filtered, washed with water to remove counter ions, and dried. Generally, the solutions are prepared so that there is one sulfo group per about 0.2 to about 2.0 diazonium groups, and more preferably 0.9 to 1.7 diazonium groups. Generally, when the polymeric adduct is to be used in the preparation of a photolithographic plate, as increasing equivalents of diazonium resin are used, the capability of the resulting printing plate to be desensitized is reduced.

The sulfopolyester should contain one sulfo group per about 500 up to about 8,000 molecular weight of polymer, with the preferred range being from about 1,500 to about 3,000 molecular weight.

Presensitized lithographic plates can be prepared by coating a solution of the radiation-sensitive polymeric adduct in a suitable solvent onto a suitable substrate and removing the solvent to provide a dry coating weight of from about 0.5 to about 2.0 grams per square meter ($g/m^2$), and perferably 0.7 to 1.5 $g/m^2$. Coating weights below about 0.7 $g/m^2$ can provide shortened plate life, increasing with increased coating weights up to about 2.0 $g/m^2$, above which plate life is not noticeably increased.

Where the plate substrate is what is termed "a low energy substrate", e.g., smooth aluminum, a most preferred coating weight is from about 0.8 to about 1.0 $g/m^2$, and where the plate substrate is from a "high energy substrate", e.g., grained and annodized aluminum, the most preferred coating weight is from about 1.1 to about 1.3 $g/m^2$.

Low boiling solvents having a boiling point at atmospheric pressure between about 40° C. and about 100° C. have utility, examples of which include dichloromethane, 1,2-dichloroethane, 1,1,2-trichloroethane, and cyclohexanone. Less desirable solvents are the higher boiling polar solvents such as dimethylformamide, N-methylpyrrolidone, and benzyl alcohol.

Substrates onto which the radiation-sensitive solutions can be coated to provide a presensitized light sensitive article include sheet materials such as paper, plastic, or metal and, preferably, those that are permanently hydrophilic and conventionally used in the preparation of lithographic plates. Aluminum, which has first been cleaned and treated to render same permanently hydrophilic, is the preferred substrate for lithographic constructions. Well-known methods of treatment include silicating, electrolytic anodizing, mechanical graining, or combinations thereof. In addition to providing a durable hydrophilic background, the treatment can also influence coating performance characteristics, such as exposure time, ease of development, image adhesion, press life, etc.

The versatility and wide variety of light-sensitive coating compositions made possibly by this invention allow one to select or arrive at preferred combinations of base and coating to achieve optimum performance.

The radiation-sensitive solution of polymeric adduct can contain modifying additives such as a thermoplastic polymer to modify or improve the physical properties of the coating. For example, properties such as developer solubility, abrasion resistance, ink receptivity, press life, etc. can be influenced by the addition of thermoplastic polymer in amounts up to about 30 percent by weight. Suitable polymers include the sulfopolyesters, other sulfonated polymers such as sulfonated polyurethanes, polyesters, polyvinyl, pyrrolidones, polyurethanes, nylons, vinylidene chloride copolymers, polyvinyl esters, polyacrylates, and alpha-alkyl polyacrylates, polyvinyl chlorides, e.g., 86 percent/14 percent vinyl chloride vinylacetate copolymer commerically available as "VYHH®" from Union Carbide, polyvinyl acetals, and polyvinyl alcohols, among others. The amounts and type of resin added to improve the formulation depends upon the specific property being altered and can be arrived at emperically.

Substractive presensitized articles are typically formulated with pigments or dyes to facilitate manufacturing control and visual appearance of the product, as well as to aid in using the article relative to positioning, developing, etc. Pre-dispersed pigments such as the "Microlith" Series (tradename for pigments pre-dispersed in a vinyl resin, commercially available from Ciba Geigy) are useful at from about 5 to 20 weight percent of the coating. Pigments such as "Monastral Blue" and "Microlith Purple" (commercially available form Ciba Giegy) can also be used in the same general concentration range using standard milling dispersion techniques. Dyes such as triphenyl methane dyes, e.g., "Victoria Blue BO", commerically available from duPont, are also useful as coloring agents, preferably at from about 0.5 to 5 percent by weight of the coating.

Dyes which provide a visible image upon exposure to actinic radiation may also be incorporated in the formulation to aid a user in visualizing the exposed article prior to development. Conventional well-known leuco dye and acid-base dye printout system can be utilized. An exemplary material is 4-(phenylazo) diphenylamine, which can be used at from about 1 to 2 percent by weight of the coating.

Organic solvent-soluble diazonium salts can also be incorporated into a solution of the light-sensitive polymeric adduct to provide printing plates which provide printed copies having improved acuity. Up to about 5 percent by weight of the organic solvent-soluble diazonium salt, based on the weight of adduct, can be effectively used. Examples of such soluble salts are the organic sulfonate salts of diazonium salts such as 4-toluene diazonium toluenesulfonate and the condensation product of formaldehyde and 4-phenylaminobenzenediazonium triisopropylnaphthalenesulfonate (TINS).

In addition, photopolymerizable components may be incorporated into the formulation to enhance the solubility diference between image and non-image areas. Unsaturated polyfunctional monomeric or oligomeric compounds, which can be polymerized under the influence of light, include acrylic esters, acrylamides, etc., which can be used at concentrations of up to about 30 percent by weight of total solids.

Preferably, a photoinitiator is included in the photopolymer formulation at from about 1 to 5 percent by weight of the coating. Preferred photoinitiators include the chromophore-substituted vinyl-halomethyl-s-triazines disclosed in U.S. Pat. No. 3,987,037.

It is preferred that the radiation-sensitive solution be coated onto a substrate that has been primed by a thin (i.e., 0.5 to 15 mg/m$^2$) layer of a subbing compound such as cellulose acetate, partially hydrolyzed polyvinyl alcohol, or an aqueous solvent-soluble polymeric diazonium compound, e.g., the chloride or zinc chloride double salt of aldehyde condensation products of p-azodiphenylamine such as is described in U.S. Pat. No. 2,714,066. With the latter subbing compound, excess sulfonated polymer can be used, wherein the sulfopolyester combines with the diazonium layer to provide desensitization of the background without necessity of added desensitizing salts in the developer. Improved humidity resistance has also been noticed.

Developers useful for developing the exposed composition include aqueous solutions of water soluble organic solvents and, optionally, buffers, desensitizers, surfactants, stabilizers and gums. Exemplary water soluble organic solvents for use in developers include ethanol, 1-propanol, 2-propanol, benzyl alcohol and 2-methoxyethanol, and can be used at a concentration of from about 2 to about 40 percent by weight depending on the alcohol selected and its solvent power. For example, the concentration of 1-propanol or 2-propanol at 20 to 40 percent by weight is preferred, whereas that preferred for benzyl alcohol is from about 2 to about 5 percent by weight. Other water-miscible solvents which can be used include ethylene glycol diacetate and -butyrolactone.

The addition of anionic surfactants or desensitizing salts to an alcohol/water solution results in the most efficient developer system.

Exemplary anionic surfactants include organic sulfonates and sulfates such as sodium dodecylbenzenesufonate, dimethylsodiumsulfoisophthalate, sodium lauryl sulfate, dioctyl sodium sulfosuccinate and sodium alkyl naphthalene sulfonate.

Exemplary desensitizing salts include ammonium sulfite, sodium sulfite, etc. The surfactant or desensitizing salt can be used in a concentration of from about 0.5 to 10 percent by weight and, preferably, from about 0.5 to 2.0 percent by weight of the developer solution.

The invention will now be more specifically described by the use of the following non-limiting examples, wherein all parts are by weight unless otherwise specified.

Sulfopolyesters "A" through "L", which will be described below, are typical of the sulfopolyesters, all of which are included within the scope of Formula I, that may be used to form the radiation-sensitive polymeric salt or adduct of the invention.

Sulfopolyester "A"

Into a 500 ml 3-neck flask equipped with a stirrer, thermometer, reflux column, and means for maintaining an atmosphere of nitrogen over the contents of the flask, were placed 136.2 g (0.92 mole) phthalic anhydride, 21.1 g (0.08 mole) 5- sulfoisophthalic acid monosodium salt, 124 g (2.0 moles) ethylene glycol, 8.4 g antimony trichloride, and 1.09 g sodium acetate. While stirring, the mixture was heated to 193° C. and held at this temperature for 4 hours. The reflux column was then replaced with a vacuum distilling head, a vacuum line was attached, and over a period of 0.5 hours the pressure reduced to less than 1.0 Torr and the temperature of the reactants increased to 250° C. These conditions were maintained for 2.5 hours, after which the reaction product, a sulfopolyester, was discharged hot from the reaction flask as honey-like resin containing 46 mole percent of components having carbonyl groups on ortho positioned carbon atoms (92 moles of o-dicarboxylic acid per 100 moles of all dicarboxylic acids). The sulfopolyester had a sulfo equivalent weight of 2,500, an inherent viscosity of 0.17 in dimethyl formamide, a glass transition temperature, Tg, of 50° C., and a molecular weight (determined by a light scattering procedure) of about 20,000. No evidence of crystallinity was observed by differential scanning colorimetry in samples annealed at 100° C. for 48 hours.

Sulfopolyesters "B-M"

Other amorphous sulfopolyesters were prepared by the procedure of Preparation A using the recactants and amounts shown in Table I. The sulfo equivalent weight and molecular weight of each sulfopolyester obtained is also shown. The polymers obtained were readily soluble in 1,2-dichloroethane and did not exhibit crystallinity.

The plate further provide dense images and scum-free prints after being stored in a moist atmosphere (95 percent relative humidity) for two weeks.

TABLE I

| SULFO-POLY-ESTER | EQ. OF SSIP PER 100 mole[1] | MOLE PERCENT PA[2] | MOLE PERCENT OTHER ACID | MOLE PERCENT EG[3] | MOLE PERCENT OTHER GLYCOL | $MW^{[4]} \times 10^{-3}$ | $-SO_3Na$ EQUIVALENT WEIGHT |
|---|---|---|---|---|---|---|---|
| B | 6  | 88 | 0                     | 100 | 0       | 16–22 | 1700 |
| C | 8  | 84 | 0                     | 100 | 0       | 14–20 | 1250 |
| D | 12 | 76 | 0                     | 100 | 0       | 12–18 | 830  |
| E | 15 | 70 | 0                     | 100 | 0       | 10–15 | 595  |
| F | 4  | 72 | 20[5]                 | 100 | 0       | 18–22 | 2500 |
| G | 4  | 82 | 10[6]                 | 100 | 0       | 18–24 | 2500 |
| H | 4  | 72 | 10[5]<br>10[6]        | 100 | 0       | 20–24 | 2500 |
| I | 4  | 76 | 16[7]                 | 100 | 0       | 18–22 | 2400 |
| J | 6  | 88 | 0                     | 0   | 100[8]  | 16–20 | 2600 |
| K | 6  | 88 | 0                     | 95  | 5[9]    | 16–20 | 3930 |
| L | 6  | 88 | 0                     | 90  | 10[9]   | 16–20 | 2450 |
| M | 10 | 40 | 50[6]                 | 100 | 0       | 20–30 | 2100 |

NOTES
[1] Equivalents of sulfo group from 5-sulfoisophthalic acid monosodium salt per 100 moles of both acids and glycols in the polyester.
[2] Moles of phthalic acid per 100 moles of all acids used in the polyester.
[3] Moles of ethylene glycol per 100 moles of all glycols.
[4] Weight average molecular weight by light scattering methods.
[5] Moles of isophthalic acid per 100 moles of all acids in the polyester.
[6] Moles of terephthalic acid per 100 moles of all acids in the polyester.
[7] Moles of hydroxycaproic acid from caprolactone per 100 moles of all acids in the sulfopolyester.
[8] Moles of 1,6-hexanediol in place of ethyleneglycol.
[9] Moles of polycaprolactonediol of molecular weight 530

EXAMPLE 1

Five grams of the amorphous sulfopolyester "A" (containing 2.0 milliequivalents of sulfo group) were dissolved in water and diluted to 1.0 percent solids. The solution was cooled to 10° C. added dropwise while stirring to 64 ml of a 1 percent aqueous solution (2.0 meq) of the zinc chloride double salt of the formaldehyde condensation product of p-diazodiphenylamine (designated "F-4-D"). A tan, finely divided solid precipitate was obtained immediately that was filtered, washed with water and dried. The precipitate could be stored for later use or immediately dissolved and coated.

Light-sensitive adducts of diazonium resins and the amorphous sulfopolyester "B–M" were prepared in similar fashion.

EXAMPLE 2

A coating solution was prepared by mixing

|  | Parts by Weight |
|---|---|
| The adduct of 1:1 equivalents of Sulfopolyester "A" and "F-4-D" diazonium resin | 1.0 |
| Victoria Blue dye (duPont) | 0.2 |
| 1,2-Dichloroethane | 19.0 |

The solution was coated onto silicated aluminum foil-paper laminates at about 1.08 g/m² (100 mg/ft²) to provide presensitized plates. The plates did not block after being stacked for periods of several months. The plates were, exposed to ultraviolet radiation through a stencil and developed with water containing 3.5 percent by weight benzyl alcohol, 2.0 percent by weight ammonium sulfite and 2.0 percent by weight sodium naphthalene sulfonate, mounted on an "AM 1250" printing press, (commerically available from Addressograph Multigraph), they provided over 1,000 copies having a dense image area and a clean, scum-free background.

EXAMPLE 3

The procedure of Example 2 was repeated using 1.0 part by weight of the adduct obtained by the procedure of Example 1 from 5.0 g of sulfopolyester "A" and 1.56 g of "F-D-4" diazonium resin, the adduct thereby having 0.5 equivalent of diazonium group per 1.0 equivalent of sulfo group. The lithographic plate obtained provided over 500 copies having a dense image-free area and a clean, scum-free background and the plates did not deteriorate after being stored for two weeks in an atmosphere at 95 percent relative humidity.

EXAMPLE 4

A radiation-sensitive adduct was prepared as described in Example 1 from 1.7 g of sulfopolyester "B" (1.0 meq) and 1.09 g of "F-4-D" diazo resin (0.35 meq). The adduct obtained was a granular powder readily soluble in 1,2-dichloroethane, dichloromethane, and cyclohexanone.

A 5.0 percent solution by weight was prepared in 1,2-dichloroethane and coated on smooth silicated aluminum to provide a dry coating weight of 0.8 g/m² (75 g/ft ²). These presensitized plates could be stacked for two weeks or longer at high humidity without blocking. Following exposure to an image, the plates were developed with a 3.2 percent aqueous solution of benzyl alcohol containing 2.0 percent by weight sodium dodecylbenzenesulfonate to provide a plate having clean, scum-free background areas. The plate could then be stored at 95 percent relative humidity for long periods of time and still used to make copies without premature plate failure.

EXAMPLE 5

A coating solution prepared as described in Example 3 was coated over a silicated aluminum sheet which had been previously sensitized with "F-4-D" diazonium resin at a coating weight of about 0.1 g/m² (10 mg/ft²).

The resultant presensitized could be stacked for prolonged periods of time without blocking

EXAMPLE 6

A coating solution was prepared by ball milling a mixture of 8.0 g sulfopolyester "A", 8.0 g "Phthalocyanine Blue", and 100 g 1,2-dichloroethane until pigment was finely dispersed. The dispersion was diluted with 300 g of 1,2-dichloroethane and then the washed polymeric adduct obtained from 12.0 g sulfopolyester "A" and 1.5 g diazo resin as described in Example 1 (providing a ratio of 0.6 equivalent of diazo to 1.0 equivalent of sulfo) and 0.75 g of the condensation product of formaldehyde and 4- phenylaminobenzenediazonium triisopropylnaphthalenesulfonate (TINS) were added to this dispersion. The solution was coated over silicated aluminum sheeting which had been previously primed with "F-4-D" diazonium resin at a coating weight of about 0.1 g/m². The presensitized plates obtained could be stored in rolled form for prolonged periods of time without blocking. On exposure and development of the plates with an aqueous developer, plates were obtained that gave sharp images even after being stored at 95 percent relative humidity for two weeks.

EXAMPLE 7

A printing plate was prepared as described in Example 2 with the exception that the polymeric adduct used was prepared from sulfopolyester "D" instead of sulfopolyester "A" and the coating solution was coated over silicated aluminum sheeting which had been primed with "F-4-D" as described in Example 6. The presensitized plates obtained could be stacked for prolonged periods of time without blocking. Printing plates obtained following exposure and development could be stored in a moist temperature for at least two weeks and still provide dense image, scum-free prints.

EXAMPLE 8-16

Similar results to those obtained in Example 7 were achieved when Example 7 was repeated using the sulfopolyesters "E" through "M" in place of sulfopolyester "D".

We claim:

1. A light-sensitive adduct consisting of the combination of a diazo resin having a plurality of pendant diazonium groups and an amorphous sulfopolyester having a plurality of sulfo groups, said sulfo polyester comprising the esterification product of at least one organic diol and at least one carboxylic acid wherein at least about 30 mole percent thereof is selected from ortho-arylene and peri-arylene carboxylic acids, the arylene group thereof having from 6 to 14 carbon atoms, said sulfopolyester containing from about 1.0 to about 15 mole percent of sulfo groups based on the total moles of said diol and said carboxylic acid, said adduct being formed from the metathetical reaction of sulfo group-containing moieties of said sulfopolyester and said diazonium groups.

2. The adduct of claim 1 wherein said sulfopolyester contains one sulfo group per about 500 to about 8,000 molecular weight.

3. The adduct of claim 2 wherein said molecular weight is from about 1,500 to about 3,000.

4. A presensitized light-sensitive article comprising a substrate having coated on one surface thereof a light-sensitive coating comprising an effective amount of an adduct, said adduct consisting of a combination of a diazo resin having a plurality of pendant diazonium groups and an amorphous sulfopolyester having a plurality of sulfo groups, said sulfo polyester comprising the esterification product of at least one organic diol and at least one carboxylic acid wherein at least about 35 mole percent thereof is selected from ortho-arylene and peri-arylene carboxylic acids, the arylene group thereof having from 6 to 14 carbon atoms, said sulfopolyester containing from about 1.0 to about 15 mole percent of sulfo groups based on the total moles of said diol and said carboxylic acid, said adduct being formed from the metathetical reaction of sulfo group-containing moieties of said sulfopolyester and said diozonium groups.

5. The light-sensitive article of claim 4 wherein said sulfopolyester contains one sulfo group per about 500 to about 8,000 molecular weight of said sulfopolyester.

6. The light sensitive article of claim 5 wherein said molecular weight is from about 1,500 to about 3,000.

7. The light sensitive article of claim 4 wherein said coating further contains a pigment dispersed therein.

8. The light sensitive article of claim 4 wherein said coating further contains a diazonium salt therein.

9. The light sensitive article of claim 8 wherein said diazonium salt is the condensation product of formaldehyde and 4-phenylaminobenzenediazonium trrisopropylnaphthalene sulfonate.

10. The light sensitive article of claim 4 wherein said coating further contains a photopolymerizable component therein.

11. The light sensitive article of claim 4 wherein a subbing layer is interposed between said coating and said substrate.

12. The light sensitive article of claim 11 wherein said subbing layer comprises an aqueous solvent soluble polymeric diazonium compound.

* * * * *